United States Patent [19]

Kash et al.

[11] Patent Number: 5,012,304
[45] Date of Patent: Apr. 30, 1991

[54] SEMICONDUCTOR DEVICES HAVING STRAIN-INDUCED LATERAL CONFINEMENT OF CHARGE CARRIERS

[75] Inventors: Kathleen Kash, Freehold; John M. Worlock, Fair Haven, both of N.J.

[73] Assignee: Bell Communications Research, Inc., Livingston, N.J.

[21] Appl. No.: 324,311

[22] Filed: Mar. 16, 1989

[51] Int. Cl.$^5$ .............. H01L 29/000; H01L 49/000; H01L 29/240; H01L 29/960
[52] U.S. Cl. ........................... 357/007; 357/4; 357/16; 357/26
[58] Field of Search ............... 357/4, 15, 16, 24, 26, 357/55, 56, 30 E, 23.2, 4 SL, 7; 252/62.9

[56] References Cited

U.S. PATENT DOCUMENTS

| | | | |
|---|---|---|---|
| 4,194,171 | 3/1980 | Jelks | 333/149 |
| 4,683,484 | 7/1987 | Derkits, Jr. | 357/16 |
| 4,807,006 | 2/1989 | Rogers et al. | 357/30 |
| 4,827,320 | 5/1989 | Morkoc et al. | 357/22 |
| 4,872,038 | 10/1989 | Bernstein et al. | 357/16 |
| 4,899,201 | 2/1990 | Xu et al. | 357/4 |

OTHER PUBLICATIONS

G. C. Osbourn et al. A GaAs$_x$P$_{1-x}$/GaP Strained Layer Superlattice Appl. Phys. Lett. 41(2), Jul. 15, 1982, pp. 172–174.
J. P. Wolfe et al., Strain Confined Excitons and Electron-Hole Liquid Electron Hole Droplets in Semiconductors, pp. 431–437 North-Holland.
Stress Variations and Relief Patterned in GaAs Grown on Mismatched Substrates, B. C. Yacobi et al., Appl. Phys. Lett. 52(7), pp. 555–557, 2/15/88.
Cathodoluminescence Observation of Metalization Appl. Phys. Lett. 52(21), pp. 1806–1808, 5/23/88.
"Strain-Confined Excitons and Electron-Hole Liquid," J. P. Wolfe "Electron-Hole Droplets in Semiconductors," Edited by C. D. Jeffries and L. V. Keldysh, pp. 431–437, North-Holland (1983).
"Stress Variations and Relief in Patterned GaAs Grown on Mismatched Substrates," B. G. Yacobi et al., Appl. Phys. Lett. 52 (7), pp. 555–557, Feb. 15, 1988.
"Cathodoluminescence Observation of Metalization-Induced Stress Variations in GaAs/AlGaAs Multiple Quantum Well Structures," B. G. Yacobi et al., Appl. Phys. Lett. 52 (21), pp. 1806–1808, May 23, 1988.
"Optical Surface Wave Mode Converters and Modulators Utilizing Static Strain-Optic Effects," K. Yamanouchi et al., IEEE Journal of Quantum Electronics, vol. QE-16, No. 6, pp. 628–634, Jun. 1980.

Primary Examiner—Michael C. Wimer
Assistant Examiner—Peter Toby Brown
Attorney, Agent, or Firm—James W. Falk; Leonard Charles Suchyta

[57] ABSTRACT

A semi-conductor device having the properties of carrier confinement induced by local variations of strain comprising a semi-conductor base material, a vertical confinement layer over the semi-conductor base material for vertical confining charge carriers and a strain layer which creates a local strain pattern in the underlying semi-conductor material which strain pattern laterally confines charge carriers in accordance with the strain pattern. The semi-conductor base may include a quantum-well, e.g., one formed utilizing a superlattice structure, where the charge carriers are laterally confined within the quantum well by the strain pattern.

1 Claim, 4 Drawing Sheets

SEMICONDUCTOR DEVICES HAVING STRAIN-INDUCED LATERAL CONFINEMENT OF CHARGE CARRIERS

FIELD OF THE INVENTION

This invention relates to semiconductor devices and particularly to semiconductor devices having strain-induced confinement of charge carriers.

BACKGROUND OF THE INVENTION

As semiconductor devices are scaled down to smaller and smaller dimensions, the ability to laterally restrict or confine the motion of the charge carriers in the devices to very small dimensions becomes increasingly important.

The planar confinement of excitons in semiconductor superlattices and quantum wells has resulted in linear and nonlinear optical properties that are greatly different from those of the constituent bulk materials. These new optical properties have been extremely useful in the development of novel optical devices. The possibility of confining excitons laterally—to "wires" or "dots" in the plane of the layered materials—as well as perpendicular to the layers is an intriguing one. Predictions of novel linear and nonlinear optical effects of confinement of carriers in all three dimensions have been made recently.

However, there has been relatively little experimental work reported on optical properties of laterally confined carriers in semiconductor superlattices and quantum wells. There are several recent reports of measurements of photo-luminescence and cathodoluminescence of "quantum dots", defined either by etching confining structures or by patterned ion implantation and annealing. Blue shifts of the exciton luminescence peak have been attributed to increased zero-point energy associated with the lateral confinement in some of these structures. Multiple peaks have been ascribed to the lifting of energy level degeneracies by lateral confinement.

There are both advantages and drawbacks to the fabrication methods reported to date for achieving lateral confinement of excitons in quantum wells. Confining excitons by etching through a well exposes a free surface which may be considerably damaged in the etching process. Patterned ion implantations with subsequent annealing results in patterned layer intermixing and a parabolic-like lateral potential well for carriers. This method for microstructuring is reported to yield large confinement energies. Its disadvantages, however, include its incompatibility with low temperature processing, limited control of the profile of the potential well, and possible non-recoverable damage to the electrical or optical properties of the material caused by the ion implantation process.

More particularly, B. G. Yacobi et al. have reported in two articles in *Applied Physics Letters* 52, 555–557 and 1806–1808 (1988) cathodoluminescence observations of metallization-induced stress variations in GaAs/AlGaAs multiple quantum well structures. The stresses are induced under 0.4 nm gold layers on the semiconductor structure and cause a change in the band gap of the material leading to both electron and hole confinement.

K. Yamonouchi et al. have reported in *IEEE Journal of Quantum Electronics* QE16 (6), 628–634 (1980) optical surface wave mode converters and modulators utilizing static strain-optic effects. Here, periodic perturbations of dielectric waveguides are obtained via the static strain-optic effect by evaporating an $SiO_2$ thin film grating on a Ti diffused $LiNbO_2$ waveguide. Strain appears in the waveguide when the thermal expansion coefficients of the evaporated film are different from those of the waveguide, owing to the temperature difference between the evaporation and operation of the device.

J. P. Wolfe et al. review in pages 433–437 in *Electron-Hole Droplets in Semiconductors* edited by C. D. Jeffries and L. V. Keldysh, North-Holland (1983) their work on recombination luminescence emanating from a strain-confined drop of electron-hole liquid in Ge and Si indirect bandgap semiconductors.

U.S. Pat. No. 4,683,484 issued to G. E. Derkits, Jr. on July 28, 1987 discloses non-invasive structures for laterally confining a single type of charge carrier in the narrow bandgap layers of a multiple quantum well semiconductor device useful in charge coupled devices. Here, confinement is attained by the formation of electric fields in a structure comprising alternating wide and narrow bandgap semiconductor layers to create steps in the conduction and/or valence bands.

SUMMARY OF THE INVENTION

A direct bandgap semiconductor device comprises a semiconductor base and a film of a dissimilar material on the base wherein the film creates a strain pattern in the semiconductor base corresponding to the film pattern and wherein the strain pattern provides lateral spatial confinement of charge carriers within the regions of the semiconductor as defined by the strain pattern.

DETAILED DESCRIPTION OF THE INVENTION

The present invention defines a new class of semiconductor structures based upon carrier confinement by externally imposed (patterned) local variations of strain. Previous carrier confinement in semiconductor devices has been achieved essentially by variations either of chemical compositions (e.g. heterostructure) or of electrostatic potentials.

It is well know that strain can affect energy levels of electrons and holes in semiconductors by as much as 0.1 eV. It is also well known that highly strained uniform films can be prepared on crystalline semiconductor substrates by epitaxial growth of another semiconductor of somewhat different lattice constant (pseudomorphic growth), by the deposition of a film with a different coefficient of thermal expansion, or by growth by plasma deposition of strained layers such as "diamond-like carbon" films. Generally, strain is considered to be a nuisance because it prevents arbitrarily thick films from being grown, leading to unwanted bowing of the semiconductor substrate or to the creation of large concentrations of undesirable defects.

The present invention is based upon the recognition that such strained films can be patterned to create a corresponding strain pattern in the semiconducting substrate, and that this strain pattern can be used to provide spatial confinement of both electrons and holes. One advantage of this approach is that strain confinement occurs to depths comparable to the lateral dimensions of the pattern, so that carriers can be confined beneath protective, passivating, or otherwise desirable intervening layers. A second advantage is that strain confinement operates independently of electrostatic and chemical-composition effects. It can therefore be used either to complement or to counteract these familiar effects.

Figure 1:
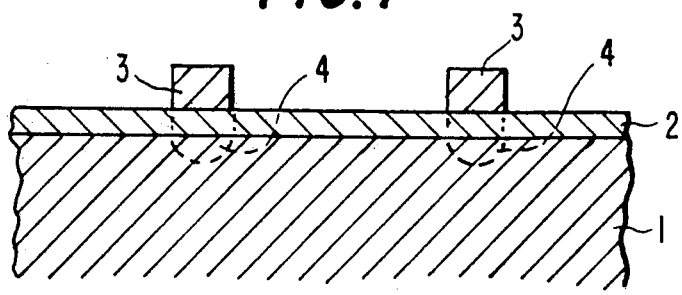
FIG. 1 is a schematic representation of a cross-section of an embodiment of a semiconductor device in accordance with the present invention.
Figure 2:
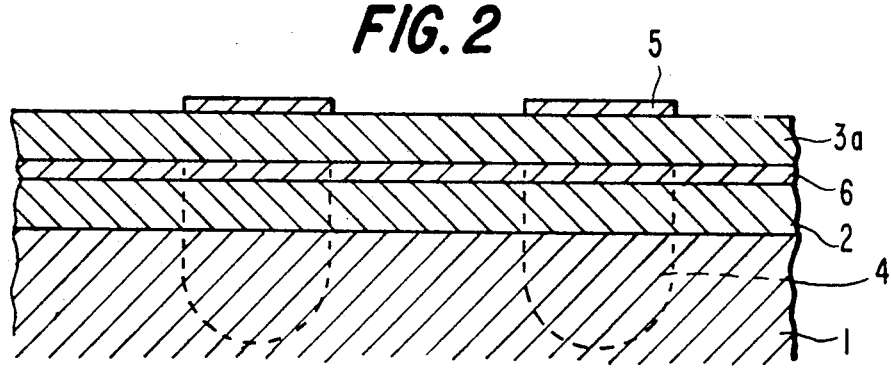
FIG. 2 is a schematic cross-sectional representation of another embodiment of the invention.

Novel semiconductor devices embodying this invention employ patterned overlayers of a dissimilar material grown on a planar semiconductor surface, as indicated in FIGS. 1 and 2. These overlayers provide stress at the interface leading to the bandgap variations sketched in FIGS. 3 and 4, which are consequences of the inhomogeneous strain as calculated from elasticity theory.

Use of these new structures is primarily envisioned in devices taking advantage of the lateral carrier confinement. One of the novelties of the new structures is that both signs of carrier are confined, so that the reduction in dimensionality applies as well to neutral particles, such as excitons and the electron-hole pairs responsible for optical emission in semiconductor injection lasers. It also allows the possibility of bipolar transport in structures of reduced dimensionality.

In addition, one may externally control the stress, e.g. using piezoelectric overlayers as shown in FIG. 2. Such structures allow for the use of the devices as an optical exciton shift register.

Referring to FIG. 1, there is shown a simple embodiment of the invention wherein a semiconductor material 1 having a confining layer 2 on the surface thereof is provided with a patterned strained layer 3 over the surface of the confining layer 2.

The semiconductor material 1 is preferably a direct band gap material e.g. GaAs, InP and other binary and higher order III-V compounds. The material may be doped to provide carriers, alternatively, means may be provided for carrier injection including optical means. Doping of the semiconductor material 1, if used, may be uniform or layered. Further, the semiconductor base material 1 may have single or multiple quantum wells. Further, it may have a superlattice structure as is known in the art to provide the quantum wells.

The confinement layer 2 is generally in the order of about 20 to several thousand Angstroms thick and more typically from about 50 to 1000Å thick and is preferably, but not necessarily, of a material having a bandgap larger than the direct bandgap of the underlying semiconductor material 1. The function of the confinement layer is to vertically confine charge carriers in the underlying semiconductor base to that base. The confinement layer need not be a direct bandgap semiconductor. For example, suitable confinement layer materials also include indirect bandgap materials e.g. AlAs on a GaAs substrate; insulators e.g. $SiO_2$; and Schottky barrier metal layers, e.g. Au. It should be noted that where vertical confinement of both types of charge carriers is desired, the bandgap of the semiconductor base material should be within the bandgap of the confinement layer material. If confinement of only one type of charge carrier is desired, the bandgap of the confinement layer may overlap the bandgap of the semiconductor base material.

The strained patterned layer 3 may be of the same or different material as the confinement layer 2. Strain can be created in many ways. For example, (a) by use of a material having a different coefficient of thermal expansion than the underlying semiconductor material, such as AlAs on a GaAs base material; (b) epitaxially growing a material having a lattice mismatch with the underlying base material or (c) plasma grown films such as diamond-like carbon films. The pattern which may be employed is substantially unlimited. For example, it may be a regular or irregular pattern and may comprise anything from a simple dot to an array of dots, a single line to an array of lines. Line patterns can be straight or curved lines, crossed lines or the like. The individual dots or lines creating the strain-confinement pattern in one or more quantum wells in the underlying semiconductor material are in the same order of size as or larger than the confinement region, e.g. about 100 to several (less than ten) thousand angstroms allowing strain-induced confinement of charge carriers to regions 4. The strain induced in the semiconductor base material 1 is one of near surface inhomogeneous strain resulting in attraction and repulsion of charged carriers (electrons and holes) and neutral carriers (excitons).

It may be noted that the strained layer 3 may be grown pseudomorphically of a semiconductor material of different composition but the same crystal symmetry as the underlying confinement layer 2 or with partial strain relaxation. The strained layer 3 can be grown under tension or compression as a smooth layer which may then be patterned and etched, or it may be grown directly in the desired pattern with use of patterned growth masks as known in the art.

As an alternative, as shown in FIG. 2, one can employ a piezoelectric material 3a as the strained layer over the confinement layer 2. In such a structure, electrodes 5 and 6 are respectively provided on the upper and lower surfaces of the piezoelectric. In this embodiment, patterning can be accomplished either by patterning the piezoelectric material 3a or by patterning at least one of the electrode layers, e.g. layer 5, in contact with the piezoelectric 3a, which then may be a continuous layer. The use of such a material allows one to induce strain in a pattern of a magnitude and sign which may be varied with the voltage applied to the electrodes 5 and 6.

Figure 3:
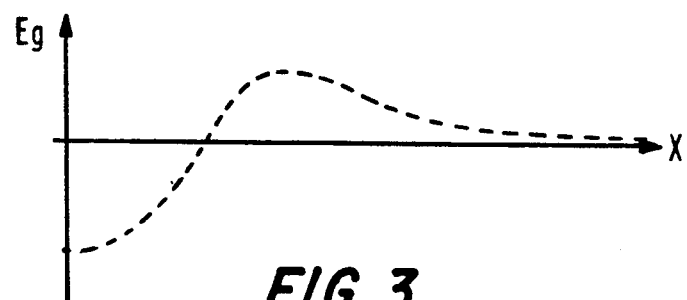
FIG. 3 is a plot of strain-induced bandgap energy $E_g$ as a function of lateral distance X from the center of a strain-inducing layer.
Figure 4:
FIG. 4 is a plot of strain-induced bandgap energy as a function of depth, Z, from the surface of a semiconductor under the center of a strain-inducing layer.

In the embodiment shown in FIGS. 1 and 2, we will consider a single "button" or dot of strained material 3 on the confinement layer 2 where the button is under compression in horizontal directions. In such a case, the underlying semiconductor 1 will be locally under tension at least near its interface with the confinement layer 2 and under the central area of the button. Near and beyond the button's edges, the underlying semiconductor 1 is compressed. This leads to a bandgap energy, $E_g$, as a function of distance X, from the center of the button as shown in FIG. 3. As can be seen, an energy well is created in the region under the center of the button. From FIG. 4, wherein $E_g$ is plotted as a function of depth, Z, of the strain in the semiconductor 1, it can be seen that the depth of the bandgap energy well is of the same order of magnitude as the button size.

Figure 5:
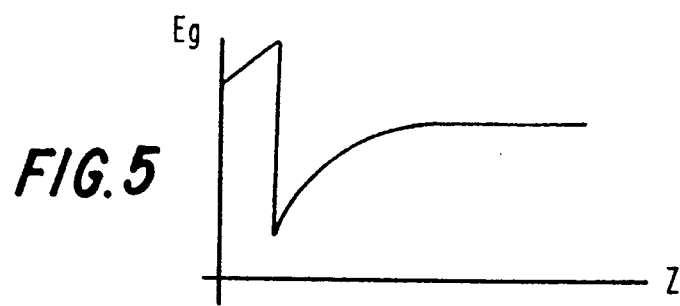
FIG. 5 is a plot of potential $E_g$ versus depth, Z, in another embodiment of the invention.

In the structures described above, three dimensions of carrier confinement are created: lateral confinement by the lateral strain pattern; and vertical confinement by the combination of vertical strain pattern and the confinement layer 2. In the simplist configuration, the strain layer, i.e. the button 3, can be chosen to have a large enough bandgap so as to also provide vertical confinement, thereby eliminating the necessity of a separate confinement layer. The confinement layer 2 should be thinner than the vertical decay depth of the strain shown in FIG. 4. This leads to a vertical potential as shown in FIG. 5 without substantially changing the radial confinement. The vertical confinement can also be insured as shown in FIG. 6 with a conventional quantum well built into the semiconductor base material within the decay depth of the strain.

Where the stressed layer is a linearly patterned layer as opposed to a button, two dimensions of confinement will result. Further, periodic arrays of buttons or linear strained layers can be employed to achieve desired special properties of the carriers in the semiconductors.

Figure 6:
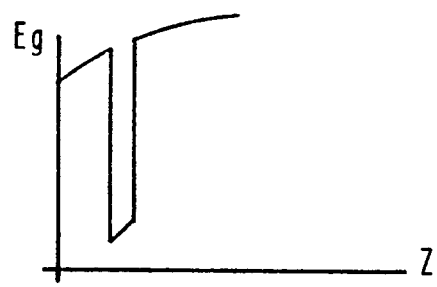
FIG. 6 is another plot of potential, $E_g$, versus depth Z, of an embodiment having a conventional quantum well.

If desired, such a linearly patterned layer over a standard two-dimensional quantum well heterostructure where conduction is provided by carriers under the stressed patterned layer, e.g. by modulation doping, will convert the properties to a one-dimensional conductor (see FIGS. 5–6).

It may be noted that strains in the order of only 1%, as may be generated by at least some of the aforementioned techniques, can feasibly create changes in bandgap energies in the order of 100 meV. Since the strain reverses near the edge of the stressed layer, the width of the confinement region (i.e. the potential well) is controlled by the size of the button or width of the linear stressed layer. Further, the previous discussion deals with stress of a particular sign (i.e. in a particular direction). It is easily possible to design a structure wherein the sign of the stress is reversed. In this instance, carrier confinement will occur in the uncovered regions of the semiconductor adjacent the stressed layer rather than under the layer. Use of the previously described piezoelectric stress layer can facilitate changing the sign as well as the magnitude of the strain induced in the semiconductor layer. An array of such structures could constitute a shift register for carriers in the wells which could be optically addressed. It should be understood that the discussions of strain referred to in the figures only takes into account the hydrostatic component of strain (the major component). Other components of strain will affect the analysis especially in crystalline structures with anisotropic elastic and/or electronic properties.

The following is a specific example of a microstructure for confining an exciton by inhomogeneous strain in the plane of a single quantum well.

The inhomogeneous strain is induced by the patterned removal of strained material above the well. In the example discussed below, the strain is generated by the relaxation of an initially uniformly strained AlGaAs barrier. The relaxation occurs when patterns are partially etched through the barrier, leaving the quantum well itself intact. The variation in strain introduced in the underlying material introduces a lateral variation in the band gap via the deformation potential. We believe both electrons and holes, and thus excitons, to be confined to the regions of smaller band gap. Evidence for exciton confinement in these microstructures is presented. It should be understood that this example is not meant to be limiting and is merely presented as one specific embodiment of the invention.

Figure 7:
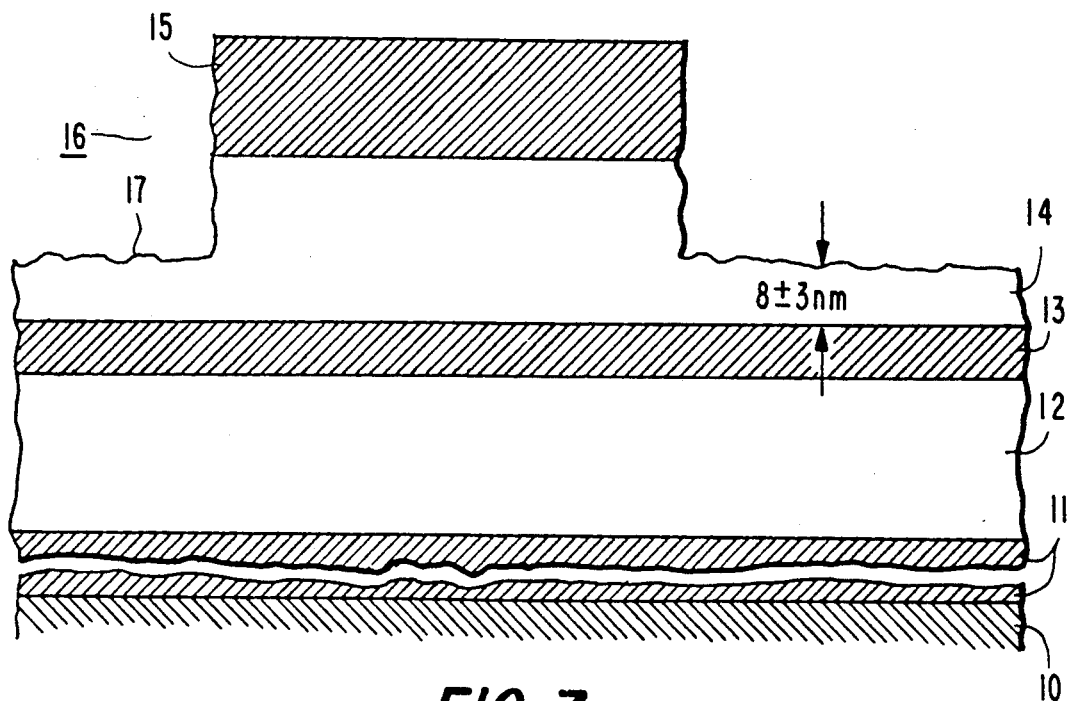
FIG. 7 is a schematic diagram of the cross section of a "wire" confinement structure.

FIG. 7 shows a schematic cross section of a microstructure formed from a planar sample. The planar sample in which the microstructure was made was grown by molecular beam epitaxy on a semi-insulating GaAs substrate 10. The layers were grown in the following order: a 500 nm GaAs buffer layer 11, a 20 nm $Al_{0.3}Ga_{0.7}As$ barrier layer 12, a 6 nm GaAs quantum well 13, a 20 nm $Al_{0.3}Ga_{0.7}As$ combination confinement and strain producing layer 14, and a 15 nm GaAs cap 15. Electron beam lithography of etch masks and plasma etching were used to pattern arrays of "wires" 16 approximately 63 nm wide on 375 nm centers covering an area $50 \times 50$ $\mu$m. Uniformly exposed mesas (not shown) 80 $\mu$m square, were located adjacent to the active microstructure patterns. The etch mask used overlying the cap layer 15 to define the wires 16 and mesas was a 15 nm thick layer of Cr. Etching was done with $Cl_2$ gas and 150 eV Argon. The arrays of wires 16 and mesas were surrounded by uniformly etched areas 17. Etching was terminated 8+3 nm above the GaAs well interface, as measured by reflection electron microscopy and by a Dektak II profilometer. It is important to note that in this embodiment the same layer (layer 14) which acts as a confinement layer, also provides the strain pattern, the pattern being related to the differences in thickness in the layer 14.

Figure 8:
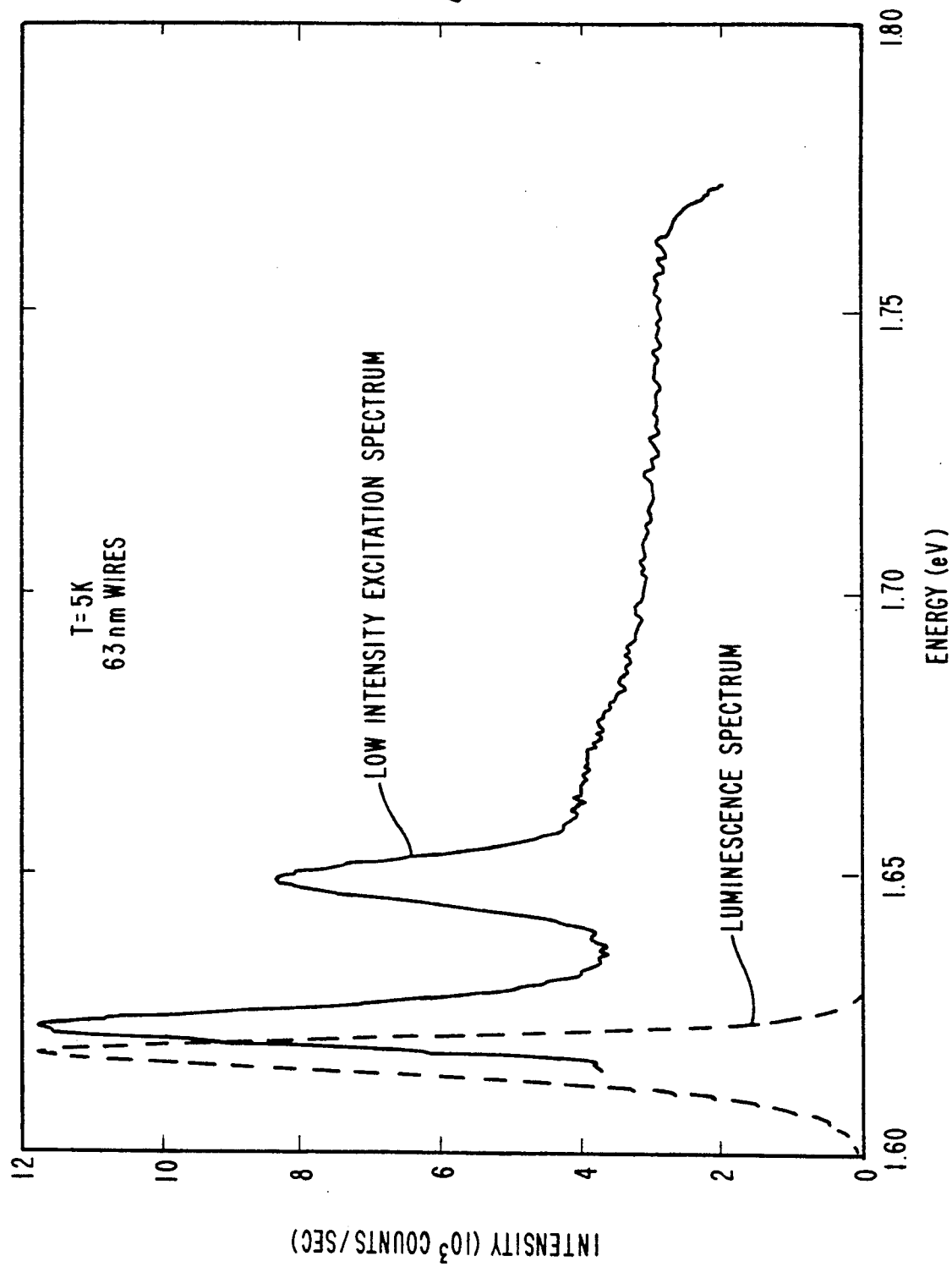
FIG. 8 is a low intensity (50 W/nm) excitation spectrum (solid line) and luminesence spectrum (dashed line) of a set of wires of 63 nm width.

FIG. 8 shows luminescence and excitation spectra for the wires. The spectra were taken at low temperature (approximately 5° K.) and low excitation intensity. The lowest energy feature in both luminescence and excitation spectra, which is the heavy hole exciton peak, is 7 meV wide, slightly broader than the 5 meV luminescence linewidth of the well before patterning. The heavy hole exciton peak in excitation spectroscopy is shifted less than 1 meV upon patterning.

We were unable to detect luminescence from the well in the regions of the sample where the barrier is uniformly etched, even at the highest excitation intensity. At the highest excitation intensity, the luminescence signal from these regions is at least 3½ orders of magnitude less than that of the unetched material. This result indicates that even though the GaAs quantum well remains, the material has been highly damaged by etching with the consequence of rapid non-radiative recombination. Since the etch depth of approximately 27 nm is much smaller than the spacing between wires (310 nm), we expect that the structural damage that occurs in the regions of the quantum well lying between the masked wires will be identical to that in the broad, uniformly etched areas of the sample. Diffusion lengths at 5° K. for free excitons in GaAs quantum wells are of the order of microns. Thus, since this diffusion length is much larger than our wire width, we expect excitonic lifetimes and luminescent efficiencies to be greatly reduced in the microstructures unless the excitons are confined to the undamaged regions under the etch mask.

Figure 9:
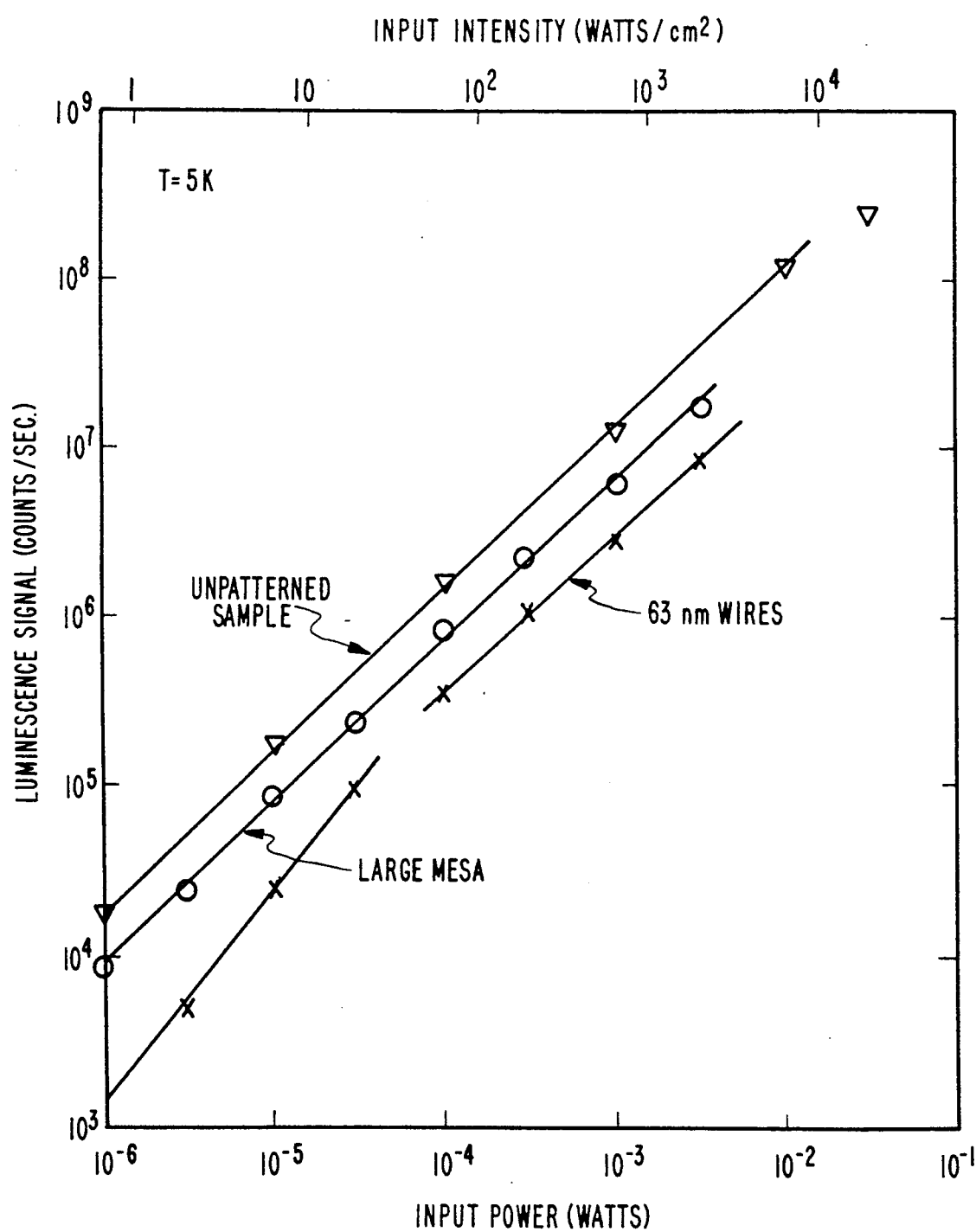
FIG. 9 is a plot of luminescence peak intensity vs. excitation intensity for the as grown material, the large mesa, and the 63 nm wide wires.

FIG. 9 shows the quantum well heavy hole exciton luminescence signal versus input power for the as-grown material, the large mesa, and the set of wires. The illuminated spot was 30 μm in diameter. The masked wires cover only 20% of the sample area in the microstructured regions. In the linear regime (above approximately $10^{-4}$ W input power) the luminescence intensity from these regions is reduced, compared to that from the as-grown material, to approximately the same proportion of 20%. The external luminescence efficiency of the wires is equal to the very high efficiency of the as-grown material. In contrast, luminescence from the broad, uniformly etched surrounding areas (not shown) is lower by at least 3½ orders of magnitude. This result is only explicable if the excitons are confined in these microstructures so as to be prevented from diffusing to the damaged areas between the wires where they would recombine nonradiatively.

This absence of exciton diffusion is explained by exciton confinement by inhomogeneous strain in the plane of the well, resulting from patterning the AlGaAs overlayer. Although the bulk lattice constants of AlAs and GaAs substrate are almost equal at the growth temperature, AlGaAs barriers pseudomorphic to the GaAs substrate are under slight compression at room temperature and below. The selective removal of material by patterned etching allows the remaining compressed AlGaAs close to the edge of the wire to expand, putting the well material underneath the wires near the edges under tension, and the well material between the wires near the edges under compression. This distortion of the lattice constant at the edges of the wires causes a corresponding lateral variation of the potential seen by electrons and holes. An order-of-magnitude estimate of the expected lateral potential variation may be given by the product of the deformation potential of GaAs (approximately 10 eV) and the strain needed to lattice match to $Al_{0.3}Ga_{0.7}As$ (0.05%). This estimate yields roughly 5 meV, which is small compared to the GaAs-AlGaAs barrier height but large enough to confine excitons at 5° K. lattice temperature. For the 63 nm wire width of these structures, and only a 5 meV potential barrier, a measurable shift of the exciton energy is not expected.

Because GaAs and AlAs are nearly lattice matched, the GaAsAlGaAs system is not the optimum one for the study of strain confinement. As much as an order of magnitude greater confinement potential is expected in structures with greater strain. Pseudomorphic structures with much greater lattice mismatch, such as the InAs-GaAs system or GaAs-AlInAs, may be patterned in a similar manner. Strain confinement may also be advantageously used to keep carriers confined away from etched surfaces, thus lowering the effect of surface recombination in microstructures produced by etching through the quantum well layer. This effect may contribute to anomalously high luminescence efficiencies observed in some etched structures. Other useful techniques for creating laterally strain-confined structures include the high temperature deposition of mask material of thermal expansion coefficient different from that of the underlying material, for example $SiO_2$ on GaAs, as has been done for waveguiding via strain-induced index variation. Finally, as previously mentioned, highly strained diamond-like carbon films may be deposited at low substrate temperature. In all of these cases, lateral potential barriers comparable to the vertical quantum well barriers may be expected, yielding significant lateral confinement even at room temperature.

Another structure exhibiting lateral carrier confinement which we have made was formed on an InP substrate and has sequentially a ~20 nm InP epi-layer; a 15 nm thick InGaAs quantum well layer; a 20 nm thick InP confinement layer and a patterned 100 nm thick InGaAsP strained layer.

What is claimed is:

1. A semiconductor device comprising
a semiconductor base layer,
a confinement layer formed on said semiconductor base layer for vertically confining charge carriers in said base layer, said confinement layer having a top planar surface,
and means for creating in said base layer a permanent strain field for providing permanent lateral spatial confinement of charge carriers in said base layer, said means consisting only of a strained semiconductor layer having a patterned shape formed directly on the top planar surface of said confinement layer for creating in said base layer a permanent strain field corresponding to said patterned shape for providing permanent lateral spatial confinement of charge carriers in said base layer as determined by said permanent strain field, said strained semiconductor layer having a patterned shape consisting of spaced-apart elements that cover only some portions of the top surface of said confinement layer, with spaces between said elements to leave the remaining portions of the top surface of said confinement layer uncovered by said strained semiconductor layer.

* * * * *